(12) United States Patent
Li et al.

(10) Patent No.: US 12,057,063 B2
(45) Date of Patent: Aug. 6, 2024

(54) PIXEL CIRCUIT, DRIVING METHOD, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chuanyong Li, Beijing (CN); Teng Chen, Beijing (CN); Hui Lu, Beijing (CN); Yong Yu, Beijing (CN); Chang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/760,096

(22) PCT Filed: Aug. 24, 2021

(86) PCT No.: PCT/CN2021/114236
§ 371 (c)(1),
(2) Date: Aug. 3, 2022

(87) PCT Pub. No.: WO2023/023930
PCT Pub. Date: Mar. 2, 2023

(65) Prior Publication Data
US 2024/0212593 A1 Jun. 27, 2024

(51) Int. Cl.
*G09G 3/3225* (2016.01)
*H10K 59/121* (2023.01)

(52) U.S. Cl.
CPC ....... *G09G 3/3225* (2013.01); *H10K 59/1213* (2023.02); *G09G 2300/0426* (2013.01);
(Continued)

(58) Field of Classification Search
CPC ......... G09G 2300/0819; G09G 3/3233; G09G 2300/0861
See application file for complete search history.

(56) References Cited

U.S. PATENT DOCUMENTS

2017/0103701 A1 4/2017 Zhu et al.
2017/0110054 A1 4/2017 Sun et al.
(Continued)

FOREIGN PATENT DOCUMENTS

CN 102903333 A 1/2013
CN 105225626 A 1/2016
(Continued)

*Primary Examiner* — Van N Chow
(74) *Attorney, Agent, or Firm* — McCoy Russell LLP

(57) ABSTRACT

A pixel circuit includes a driving circuit, an energy storage circuit, a first control circuit, a first reset circuit and a data writing-in circuit; the first control circuit is configured to control to connect the second node and a first terminal of the driving circuit under the control of a light-emitting control signal; the first reset circuit is configured to write a reference voltage into the second node under the control of a first reset control signal; the data writing-in circuit is configured to write a data voltage into the first terminal of the driving circuit under the control of a scan signal; the driving circuit is configured to control to connect the first terminal of the driving circuit and the second terminal of the driving circuit under the control of the control terminal of the driving circuit.

20 Claims, 13 Drawing Sheets

(52) U.S. Cl.
CPC ............... *G09G 2300/0842* (2013.01); *G09G 2310/0202* (2013.01); *G09G 2310/08* (2013.01); *G09G 2320/0223* (2013.01); *G09G 2320/0233* (2013.01); *G09G 2320/0247* (2013.01)

(56) References Cited

U.S. PATENT DOCUMENTS

| | | | |
|---|---|---|---|
| 2019/0267435 A1 | 8/2019 | Zhou | |
| 2020/0234650 A1 | 7/2020 | Zhu et al. | |
| 2020/0388229 A1* | 12/2020 | Zhang | G09G 3/3266 |
| 2022/0114949 A1* | 4/2022 | Xuan | G09G 3/3233 |
| 2023/0111185 A1* | 4/2023 | Sun | H01L 25/167 |
| | | | 257/40 |

FOREIGN PATENT DOCUMENTS

| | | |
|---|---|---|
| CN | 105405397 A | 3/2016 |
| CN | 109147676 A | 1/2019 |
| CN | 109727571 A | 5/2019 |
| CN | 111916028 A | 11/2020 |

* cited by examiner

PIXEL CIRCUIT, DRIVING METHOD, DISPLAY SUBSTRATE AND DISPLAY DEVICE

CROSS-REFERENCE TO RELATED APPLICATION

The present application is a U.S. National Phase of International Application No. PCT/CN2021/114236, entitled "PIXEL CIRCUIT, DRIVING METHOD, DISPLAY SUBSTRATE AND DISPLAY DEVICE", and filed on Aug. 24, 2021. The entire contents of the above-listed application are hereby incorporated by reference for all purposes.

TECHNICAL FIELD

The present disclosure relates to the field of display technology, and more particularly to a pixel circuit, a driving method, a display substrate and a display device.

BACKGROUND

A pixel circuit capable of compensating for the IR drop of the power supply voltage on the power supply line (IR drop refers to a phenomenon of voltage drop or rise appearing on the power and ground networks in an integrated circuit) is in operation, and the display period includes a reset phase, a data writing-in phase, and a light emitting phase, which are arranged in sequence, the power supply voltage in the data writing-in phase is compensated by the power supply voltage in the light emitting phase, but since the power supply voltage in the light emitting phase is not equal to the power supply voltage in the data writing-in phase, the supply voltage compensation cannot be fully realized.

SUMMARY

A first aspect of the present disclosure provides a pixel circuit, comprising a driving circuit, an energy storage circuit, a first control circuit, a first reset circuit and a data writing-in circuit; a first terminal of the energy storage circuit is electrically connected to a first node, a second terminal of the energy storage circuit is electrically connected to a second node, and the energy storage circuit is used for storing electrical energy; a control terminal of the driving circuit is electrically connected to the first node; the first control circuit is respectively electrically connected to a light-emitting control line, a second node and a first terminal of the driving circuit, and is configured to control to connect the second node and a first terminal of the driving circuit under the control of a light-emitting control signal provided by the light-emitting control line; the first reset circuit is respectively electrically connected to a first reset control line, a reference voltage line and the second node, and is configured to write a reference voltage provided by the reference voltage line into the second node under the control of a first reset control signal provided by the first reset control line; the data writing-in circuit is electrically connected to a scan line, a data line and the first terminal of the driving circuit respectively, and is configured to write a data voltage provided by the data line into the first terminal of the driving circuit under the control of a scan signal provided by the scan line; the driving circuit is configured to control to connect the first terminal of the driving circuit and the second terminal of the driving circuit under the control of the control terminal of the driving circuit.

Optionally, the pixel circuit further includes a light-emitting element and a light-emitting control circuit; the light-emitting control circuit is respectively electrically connected to the light-emitting control line, the power supply voltage line, the first terminal of the driving circuit, the second terminal of the driving circuit and a first electrode of the light-emitting element, and is configured to control to connect the power supply voltage line and the first terminal of the driving circuit and control to connect the second terminal of the driving circuit and the first electrode of the light-emitting element under the control of the light-emitting control signal; a second electrode of the light-emitting element is electrically connected to the first voltage line.

Optionally, the pixel circuit further includes a second reset circuit; the second reset circuit is electrically connected to the first reset control line, the first initial voltage line, and the first electrode of the light-emitting element, respectively, and is configured to write the first initial voltage provided by the first initial voltage line into the first electrode of the light-emitting element under the control of the first reset control signal.

Optionally, the pixel circuit further includes a compensation control circuit and a third reset circuit; the compensation control circuit is electrically connected to the scan line, the first node and the second terminal of the driving circuit respectively, and is configured to control to connect the first node and the second terminal of the driving circuit under the control of the scan signal provided by the scan line; the third reset circuit is electrically connected to the second reset control line, the second initial voltage line and the first node, respectively, and is configured to write the second initial voltage provided by the second initial voltage line into the first node under the control of a second reset control signal provided by the second reset control line.

Optionally, the first control circuit comprises a first transistor; a gate electrode of the first transistor is electrically connected to the light-emitting control line, a first electrode of the first transistor is electrically connected to the second node, and a second electrode of the first transistor is electrically connected to the first terminal of the driving circuit.

Optionally, the first reset circuit comprises a second transistor; a gate electrode of the second transistor is electrically connected to the first reset control line, a first electrode of the second transistor is electrically connected to the reference voltage line, and a second electrode of the second transistor is electrically connected to the second node.

Optionally, the data writing-in circuit comprises a third transistor; a gate electrode of the third transistor is electrically connected to the scan line, a first electrode of the third transistor is electrically connected to the data line, and a second electrode of the third transistor is electrically connected to the first terminal of the driving circuit.

Optionally, the light-emitting control circuit includes a fourth transistor and a fifth transistor, and the second reset circuit includes a sixth transistor; a gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit; a gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element; a gate electrode of the sixth transistor is electrically connected to the first reset control line, a first electrode of the sixth transistor is electrically connected to the first initial voltage line, and a second electrode of the sixth transistor is electrically connected to the first electrode of the light-emitting element.

Optionally, the compensation control circuit comprises a seventh transistor, and the third reset circuit comprises an eighth transistor; a gate electrode of the seventh transistor is electrically connected to the scan line, a first electrode of the seventh transistor is electrically connected to the first node, and a second electrode of the seventh transistor is electrically connected to the second terminal of the driving circuit; a gate electrode of the eighth transistor is electrically connected to the second reset control line, a first electrode of the eighth transistor is electrically connected to the second initial voltage line, and a second electrode of the eighth transistor is electrically connected to the first node.

Optionally, the driving circuit includes a driving transistor, and the energy storage circuit includes a storage capacitor; a gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit; a first electrode plate of the storage capacitor is electrically connected to the first node, and a second electrode plate of the storage capacitor is electrically connected to the second node.

Optionally, the first control circuit includes a first transistor; the first reset circuit includes a second transistor; the data writing-in circuit includes a third transistor; the light-emitting control circuit includes a fourth transistor and a fifth transistor, the second reset circuit includes a sixth transistor; the compensation control circuit includes a seventh transistor, the third reset circuit includes an eighth transistor; the driving circuit includes a driving transistor, the energy storage circuit includes a storage capacitor; the first initial voltage line and the second initial voltage line are a same initial voltage line; a gate electrode of the first transistor is electrically connected to the light-emitting control line, a first electrode of the first transistor is electrically connected to the second node, and a second electrode of the first transistor is electrically connected to the first terminal of the driving circuit; a gate electrode of the second transistor is electrically connected to the first reset control line, a first electrode of the second transistor is electrically connected to the reference voltage line, and a second electrode of the second transistor is electrically connected to the second node; a gate electrode of the third transistor is electrically connected to the scan line, a first electrode of the third transistor is electrically connected to the data line, and a second electrode of the third transistor is electrically connected to the first terminal of the driving circuit; a gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit; a gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element; a gate electrode of the sixth transistor is electrically connected to the first reset control line, a first electrode of the sixth transistor is electrically connected to the initial voltage line, and a second electrode of the sixth transistor is electrically connected to the first electrode of the light-emitting element; a gate electrode of the seventh transistor is electrically connected to the scan line, a first electrode of the seventh transistor is electrically connected to the first node, and a second electrode of the seventh transistor is electrically connected to the second terminal of the driving circuit; a gate electrode of the eighth transistor is electrically connected to the second reset control line, a first electrode of the eighth transistor is electrically connected to the initial voltage line, and a second electrode of the eighth transistor is electrically connected to the first node; a gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit; a first electrode plate of the storage capacitor is electrically connected to the first node, and a second electrode plate of the storage capacitor is electrically connected to the second node.

In a second aspect, an embodiment of the present disclosure provides a driving method, applied to the pixel circuit according to any one of claims 1 to 11, wherein a display period comprises a reset phase, a data writing-in phase and a light-emitting phase which are set successively; the driving method includes: in the reset phase, writing, by the first reset circuit, the reference voltage into the second node under the control of the first reset control signal; in the data writing-in phase, writing, by the first reset circuit, the reference voltage into the second node under the control of the first reset control signal, and writing, by the data writing-in circuit, the data voltage into the first terminal of the driving circuit under the control of the scan signal; in the light-emitting phase, controlling, by the first control circuit, to connect the second node and the first terminal of the driving circuit under the control of the light-emitting control signal.

Optionally, the pixel circuit further comprises a light-emitting element, a light-emitting control circuit and a second reset circuit; the driving method further includes: in the reset phase and the data writing-in phase, writing, by the second reset circuit, a first initial voltage into the first electrode of the light-emitting element under the control of a first reset control signal, so as to control the light-emitting element not to emit light; in the light-emitting phase, under the control of the light-emitting control signal, controlling, by the light-emitting control circuit, to connect the power supply voltage line and the first terminal of the driving circuit, and connect the second terminal of the driving circuit and the first electrode of the light-emitting element.

Optionally, the pixel circuit further comprises a compensation control circuit and a third reset circuit; the driving method further includes: in the reset phase, writing, by the third reset circuit, the second initial voltage into the first node under the control of the second reset control signal; in the data writing-in phase, controlling, by the compensation control circuit, to connect the first node and the second terminal of the driving circuit under the control of the scan signal.

In a third aspect, an embodiment of the present disclosure provides a display substrate comprising a base substrate, and a plurality of sub-pixels arranged on the base substrate, the sub-pixel includes the pixel circuit.

Optionally, the sub-pixel includes a light-emitting control line, the pixel circuit includes a first control circuit and a driving circuit, the first control circuit includes a first transistor; the driving circuit includes a driving transistor, the first transistor includes a first active pattern; at least part of the first active pattern extends along a first direction; an orthographic projection of at least part of the first active pattern on the base substrate is located between an orthographic projection of the gate electrode of the driving transistor on the base substrate and the orthographic projection of the light emitting control line on the substrate.

Optionally, the pixel circuit includes a light-emitting control circuit, and the light-emitting control circuit includes a fourth transistor and a fifth transistor; the gate electrode of the first transistor includes a portion extending along a second direction; the gate electrode of the first transistor, the gate electrode of the fourth transistor, the gate electrode of the fifth transistor and the light emitting control line form an integrated structure.

Optionally, the sub-pixel further includes a first reset control line and a reference voltage line, and the pixel circuit further includes a first reset circuit and a second reset circuit, the first reset circuit includes a second transistor, and the second reset circuit includes a sixth transistor; the second transistor includes a second active pattern, and the sixth transistor includes a sixth active pattern; at least a portion of the second active pattern extends along a second direction, and at least a portion of the sixth active pattern extends along a second direction, an orthographic projection of at least part of the second active pattern on the base substrate is set between the orthographic projection of the light-emitting control line on the base substrate and the orthographic projection of the reference voltage line on the base substrate, an orthographic projection of at least part of the sixth active pattern on the base substrate is located between the orthographic projection of the light-emitting control line on the base substrate and the orthographic projection of the reference voltage line on the base substrate.

Optionally, the second active pattern includes a second channel portion, and the sixth active pattern includes a sixth channel portion; the second channel portion and the sixth channel portions are arranged along the first direction.

Optionally, the orthographic projection of the first reset control line on the base substrate is located between the orthographic projection of the light-emitting control line on the base substrate and the orthographic projection of the reference voltage line on the base substrate, at least part of the first reset control line, at least part of the light emitting control line and at least part of the reference voltage line are all extending along the first direction; the gate electrode of the second transistor, the gate electrode of the sixth transistor and the first reset control line form an integrated structure.

Optionally, the sub-pixel further includes a second reset control line, an initial voltage line and a scan line; the third reset circuit includes an eighth transistor; the eighth transistor includes an eighth active pattern; the eighth active pattern includes two semiconductor portions and one conductor portion; orthographic projections of the two semiconductor portions on the base substrate overlap the orthographic projection of the gate electrode of the eighth transistor on the base substrate respectively; an orthographic projection of the conductor portion on the base substrate does not overlap the orthographic projection of the gate electrode of the eighth transistor on the base substrate; the conductor portion is coupled to the two semiconductor portions; an orthographic projection of at least part of the eighth active pattern on the base substrate is located between an orthographic projection of the initial voltage line on the base substrate and an orthographic projection of the scan line on the base substrate; the gate electrode of the eighth transistor and the second reset control line form an integrated structure, and the orthographic projection of the second reset control line on the base substrate is located between the orthographic projection of the initial voltage line on the base substrate and the orthographic projection of the scan line on the base substrate.

In a fourth aspect, an embodiment of the present disclosure provides the display substrate.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative efforts shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the first electrode may be a drain electrode, and the second electrode may be a source electrode; or the first electrode may be a source electrode, and the second electrode may be a drain electrode.

Figure 1:
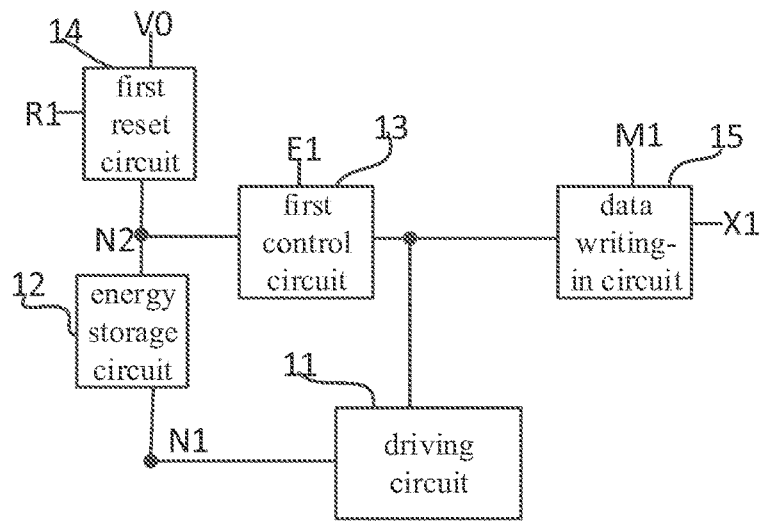
FIG. 1 is a structural diagram of a pixel circuit according to an embodiment of the present disclosure.

As shown in FIG. 1, the pixel circuit according to the embodiment of the present disclosure includes a driving circuit 11, an energy storage circuit 12, a first control circuit 13, a first reset circuit 14 and a data writing-in circuit 15;

A first terminal of the energy storage circuit 12 is electrically connected to a first node N1, a second terminal of the energy storage circuit 12 is electrically connected to a second node N2, and the energy storage circuit 12 is used for storing electrical energy;

A control terminal of the driving circuit 11 is electrically connected to the first node N1;

The first control circuit 13 is respectively electrically connected to a light-emitting control line E1, a second node N2 and a first terminal of the driving circuit 11, and is configured to control to connect the second node N2 and a first terminal of the driving circuit 11 under the control of a light-emitting control signal provided by the light-emitting control line E1;

The first reset circuit 14 is respectively electrically connected to a first reset control line R1, a reference voltage line V0 and the second node N2, and is configured to write a reference voltage provided by the reference voltage line V0 into the second node N2 under the control of a first reset control signal provided by the first reset control line R1;

The data writing-in circuit 15 is electrically connected to a scan line M1, a data line X1 and the first terminal of the driving circuit 11 respectively, and is configured to write a data voltage provided by the data line X1 into the first terminal of the driving circuit 11 under the control of a scan signal provided by the scan line M1;

The driving circuit 11 is configured to control to connect the first terminal of the driving circuit 11 and the second terminal of the driving circuit 11 under the control of the control terminal of the driving circuit 11.

A first control circuit 13 is added to the pixel circuit described in the embodiment of the present disclosure, so a mode of the mutual compensation of the power supply voltage between the data writing-in phase and the light-emitting phase in the existing pixel circuit is changed to another mode of the power supply voltage self-compensation in the light-emitting phase. In this way, the influence of the IR voltage drop on the power supply voltage line on the light-emitting current of the light-emitting element is eliminated, the display uniformity of the display product is improved, and the flicker is reduced.

In at least one embodiment of the present disclosure, in the light-emitting phase, the power supply voltage provided by the power supply line is applied to the first terminal of the driving circuit 11.

When the pixel circuit shown in FIG. 1 of the present disclosure is in operation, the display period may include a reset phase, a data writing-in phase, and a light-emitting phase that are set successively;

In the reset phase, the first reset circuit 14 writes the reference voltage into the second node N2 under the control of the first reset control signal;

In the data writing-in phase, the first reset circuit 14 writes the reference voltage into the second node N2 under the control of the first reset control signal, and the data writing-in circuit 15 writes the data voltage into the first terminal of the driving circuit 11 under the control of the scan signal;

In the light-emitting phase, the first control circuit 13 controls to connect the second node N2 and the first terminal of the driving circuit 11 under the control of the light-emitting control signal.

In at least one embodiment of the present disclosure, the pixel circuit may further include a light-emitting element and a light-emitting control circuit;

The light-emitting control circuit is respectively electrically connected to the light-emitting control line, the power supply voltage line, the first terminal of the driving circuit, the second terminal of the driving circuit and a first electrode of the light-emitting element, and is configured to control to connect the power supply voltage line and the first terminal of the driving circuit and control to connect the second terminal of the driving circuit and the first electrode of the light-emitting element under the control of the light-emitting control signal; a second electrode of the light-emitting element is electrically connected to the first voltage line.

In a specific implementation, the pixel circuit may further include a light-emitting control circuit, and in the light-emitting phase, the light-emitting control circuit is configured to control to connect the power supply voltage line and the first terminal of the driving circuit, and control to connect the second terminal of the driving circuit and the first electrode of the light-emitting element.

In at least one embodiment of the present disclosure, the first voltage line may be a low voltage line, but not limited thereto.

Optionally, the pixel circuit described in at least one embodiment of the present disclosure may further include a second reset circuit;

The second reset circuit is electrically connected to the first reset control line, the first initial voltage line, and the first electrode of the light-emitting element, respectively, and is configured to write the first initial voltage provided by the first initial voltage line into the first electrode of the light-emitting element under the control of the first reset control signal.

In at least one embodiment of the present disclosure, the pixel circuit may include a second reset circuit, and in the reset phase and the data writing-in phase, the second reset circuit is configured to write the first initial voltage into the first electrode of the light-emitting element to control the light-emitting element not to emit light, and remove the electric charge remaining in the first electrode of the light-emitting element.

Figure 2:
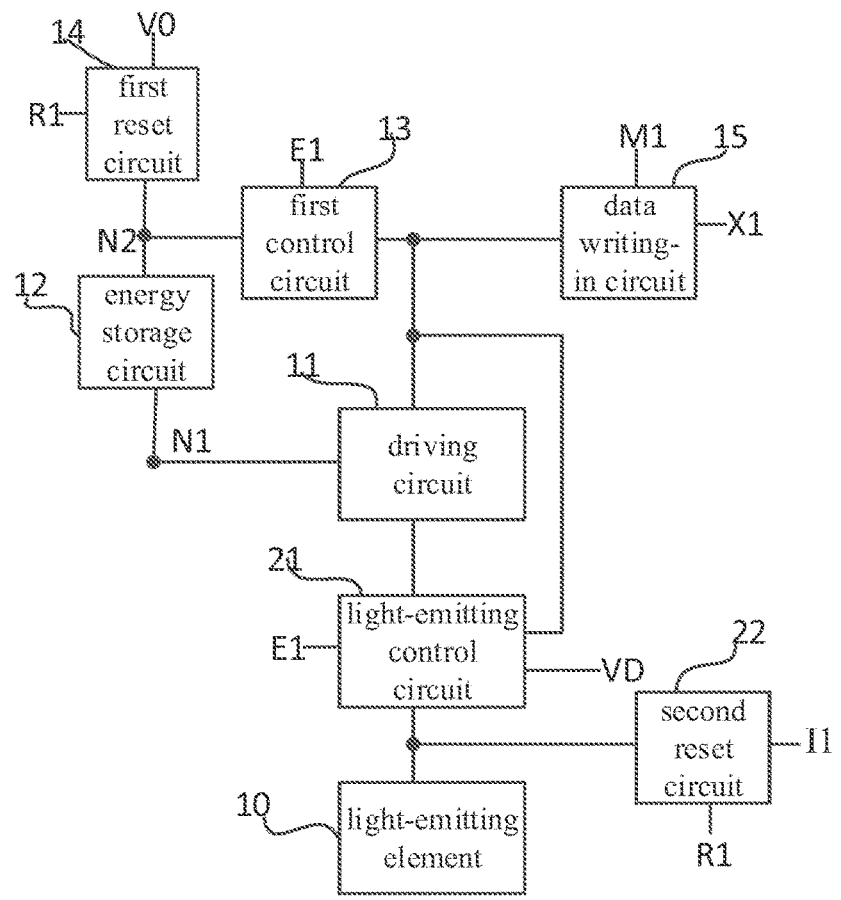
FIG. 2 is a structural diagram of a pixel circuit according to at least one embodiment of the present disclosure.

As shown in FIG. 2, based on the embodiment of the pixel circuit shown in FIG. 1, the pixel circuit described in at least one embodiment of the present disclosure further includes a light-emitting element 10, a light-emitting control circuit 21 and a second reset circuit 22;

The light-emitting control circuit 21 is electrically connected to the light-emitting control line E1, the power supply voltage line VD, the first terminal of the driving circuit 11, the second terminal of the driving circuit 11 and the first electrode of the light-emitting element 10 respectively, is configured to control to connect the power supply voltage line VD and the first terminal of the driving circuit 11 under the control of the light-emitting control signal, and control to connect the second terminal of the driving circuit 11 and the first electrode of the light-emitting elements 10; the second electrode of the light-emitting element 10 is electrically connected to the first voltage line V1;

The second reset circuit 22 is respectively electrically connected to the first reset control line R1, the first initial voltage line I1 and the first electrode of the light-emitting element 10, and is configured to write the first initial voltage provided by the first initial voltage line I1 into the first electrode of the light-emitting element 10 under the control of the first reset control signal.

In at least one embodiment of the present disclosure, the light-emitting element may be, for example, an organic light-emitting diode, the first electrode of the light-emitting element may be an anode, and the second electrode of the light-emitting element may be a cathode.

During operation of the pixel circuit shown in FIG. 2 of at least one embodiment of the present disclosure, In the reset phase, under the control of the first reset control signal, the second reset circuit 22 controls to write a first initial voltage into the first electrode of the light-emitting element 10 to control the light-emitting element 10 not to emit light;

In the light-emitting phase, under the control of the light-emitting control signal, the light-emitting control circuit 21 controls to connect the power supply voltage line VD and the first terminal of the driving circuit 11, so that the power supply voltage provided by VD is applied to the first terminal of the driving circuit 11; the light-emitting control circuit 21 controls to connect the second terminal of the driving circuit 11 and the first electrode of the light-emitting element 10 under the control of the light-emitting control signal.

The pixel circuit described in at least one embodiment of the present disclosure further includes a compensation control circuit and a third reset circuit;

The compensation control circuit is electrically connected to the scan line, the first node and the second terminal of the driving circuit respectively, and is configured to control to connect the first node and the second terminal of the driving circuit under the control of the scan signal provided by the scan line;

The third reset circuit is electrically connected to the second reset control line, the second initial voltage line and the first node, respectively, and is configured to write the second initial voltage provided by the second initial voltage line into the first node under the control of a second reset control signal provided by the second reset control line.

During specific implementation, the pixel circuit described in at least one embodiment of the present disclosure may further include a compensation control circuit and a third reset circuit; the compensation control circuit is used to compensate a threshold voltage of a driving transistor in the driving circuit, and the third reset circuit is configured to reset the potential of the first node under the control of the second reset control signal.

Figure 3:
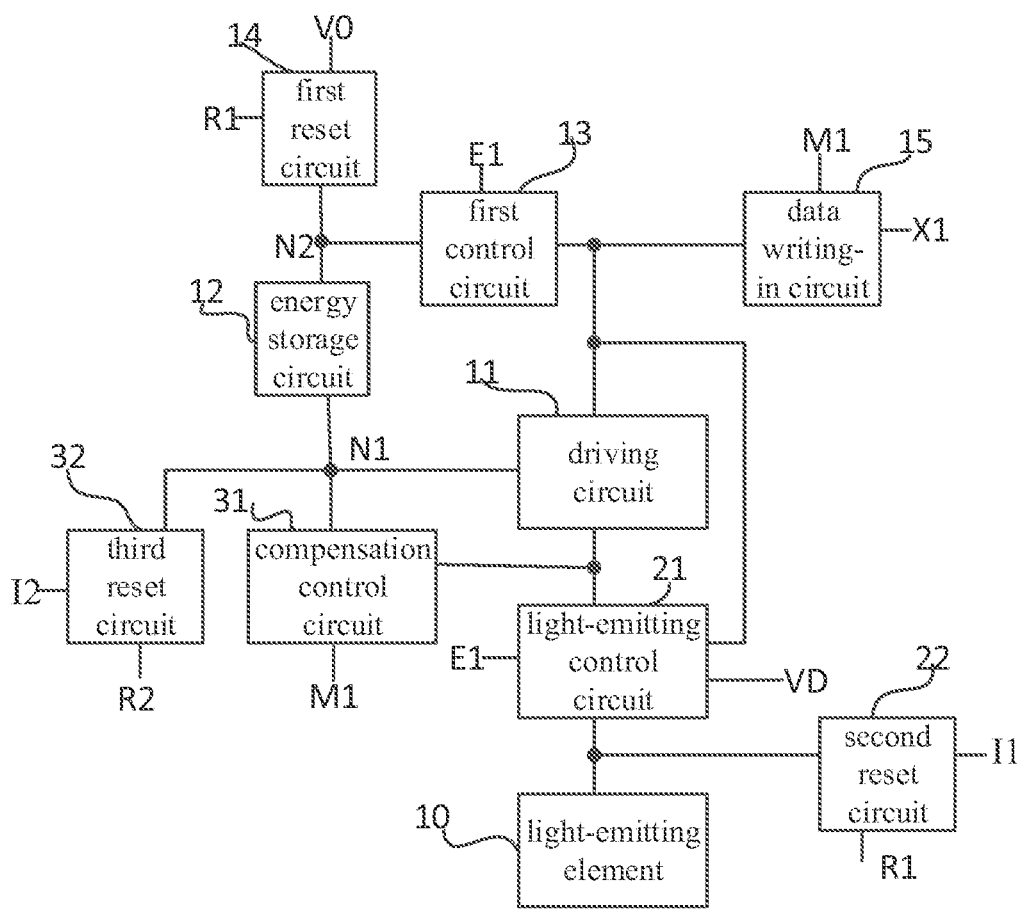
FIG. 3 is another structural diagram of a pixel circuit according to at least one embodiment of the present disclosure.

As shown in FIG. 3, on the basis of the pixel circuit shown in FIG. 2 of at least one embodiment, the pixel circuit described in at least one embodiment of the present disclosure further includes a compensation control circuit 31 and a third reset circuit 32;

The compensation control circuit 31 is respectively electrically connected to the scan line M1, the first node N1 and the second terminal of the driving circuit 11, and is used to control to connect the first node N1 and the second terminal of the driving circuit 11 under the control of the scan signal provided by the scan line M1;

The third reset circuit 32 is respectively electrically connected to the second reset control line R2, the second initial voltage line 12 and the first node N1, and is configured to write the second initial voltage provided by the second initial voltage line 12 into the first node N1 under the control of a second reset control signal provided on the second reset control line R2.

During operation of the pixel circuit shown in FIG. 3 of at least one embodiment of the present disclosure, In the reset phase, under the control of the second reset control signal, the third reset circuit 32 writes the second initial voltage into the first node N1, so that at the beginning of the data writing-in phase, the driving transistor included in the driving circuit is turned on;

In the data writing-in phase, the compensation control circuit 31 controls to connect the first node N1 and the second terminal of the driving circuit 11 under the control of the scan signal;

At the beginning of the data writing-in phase, the driving transistor in the driving circuit 11 is turned on to charge the energy storage circuit with the data voltage Vdta, so as to change the potential of N1 until the driving transistor is turned off, at this time, the potential of N1 is Vdata+Vth, wherein Vth is the threshold voltage of the driving transistor.

Optionally, the first control circuit includes a first transistor;

A gate electrode of the first transistor is electrically connected to the light-emitting control line, a first electrode of the first transistor is electrically connected to the second node, and a second electrode of the first transistor is electrically connected to the first terminal of the driving circuit.

Optionally, the first reset circuit includes a second transistor;

A gate electrode of the second transistor is electrically connected to the first reset control line, a first electrode of the second transistor is electrically connected to the reference voltage line, and a second electrode of the second transistor is electrically connected to the second node.

Optionally, the data writing-in circuit includes a third transistor;

A gate electrode of the third transistor is electrically connected to the scan line, a first electrode of the third transistor is electrically connected to the data line, and a second electrode of the third transistor is electrically connected to the first terminal of the driving circuit.

Optionally, the light-emitting control circuit includes a fourth transistor and a fifth transistor, and the second reset circuit includes a sixth transistor;

A gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit;

A gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element;

A gate electrode of the sixth transistor is electrically connected to the first reset control line, a first electrode of the sixth transistor is electrically connected to the first initial voltage line, and a second electrode of the sixth transistor is electrically connected to the first electrode of the light-emitting element.

Optionally, the compensation control circuit includes a seventh transistor, and the third reset circuit includes an eighth transistor;

A gate electrode of the seventh transistor is electrically connected to the scan line, a first electrode of the seventh transistor is electrically connected to the first node, and a second electrode of the seventh transistor is electrically connected to the second terminal of the driving circuit;

A gate electrode of the eighth transistor is electrically connected to the second reset control line, a first electrode of the eighth transistor is electrically connected to the second initial voltage line, and a second electrode of the eighth transistor is electrically connected to the first node.

Optionally, the driving circuit includes a driving transistor, and the energy storage circuit includes a storage capacitor;

A gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit;

A first electrode plate of the storage capacitor is electrically connected to the first node, and a second electrode plate of the storage capacitor is electrically connected to the second node.

In at least one embodiment of the present disclosure, the first control circuit includes a first transistor; the first reset circuit includes a second transistor; the data writing-in circuit includes a third transistor; the light-emitting control circuit includes a fourth transistor and a fifth transistor, the second reset circuit includes a sixth transistor; the compensation control circuit includes a seventh transistor, the third reset circuit includes an eighth transistor; the driving circuit includes a driving transistor, the energy storage circuit includes a storage capacitor; the first initial voltage line and the second initial voltage line are a same initial voltage line;

A gate electrode of the first transistor is electrically connected to the light-emitting control line, a first electrode of the first transistor is electrically connected to the second node, and a second electrode of the first transistor is electrically connected to the first terminal of the driving circuit;

A gate electrode of the second transistor is electrically connected to the first reset control line, a first electrode of the second transistor is electrically connected to the reference voltage line, and a second electrode of the second transistor is electrically connected to the second node;

A gate electrode of the third transistor is electrically connected to the scan line, a first electrode of the third transistor is electrically connected to the data line, and a second electrode of the third transistor is electrically connected to the first terminal of the driving circuit;

A gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit;

A gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element;

A gate electrode of the sixth transistor is electrically connected to the first reset control line, a first electrode of the sixth transistor is electrically connected to the initial voltage line, and a second electrode of the sixth transistor is electrically connected to the first electrode of the light-emitting element;

A gate electrode of the seventh transistor is electrically connected to the scan line, a first electrode of the seventh transistor is electrically connected to the first node, and a second electrode of the seventh transistor is electrically connected to the second terminal of the driving circuit;

A gate electrode of the eighth transistor is electrically connected to the second reset control line, a first electrode of the eighth transistor is electrically connected to the initial voltage line, and a second electrode of the eighth transistor is electrically connected to the first node;

A gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit;

The first electrode plate of the storage capacitor is electrically connected to the first node, and the second electrode plate of the storage capacitor is electrically connected to the second node.

Figure 4:
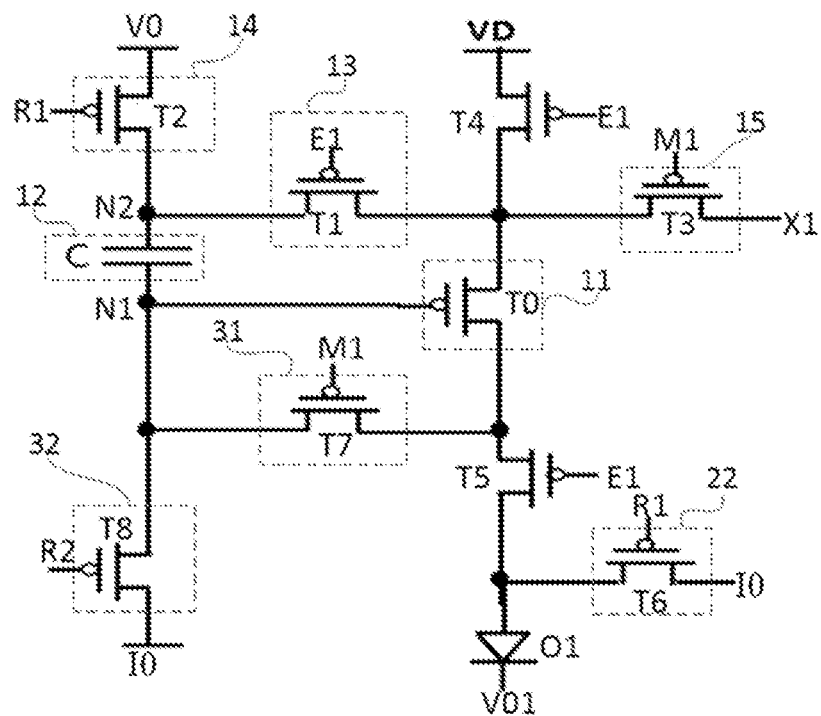
FIG. 4 is a circuit diagram of a pixel circuit according to at least one embodiment of the present disclosure.

As shown in FIG. 4, based on the pixel circuit shown in FIG. 3, the first control circuit 13 includes a first transistor T1; the first reset circuit 14 includes a second transistor T2; the data writing-in circuit 15 includes a third transistor T3; the light-emitting control circuit includes a fourth transistor T4 and a fifth transistor T5; the second reset circuit 22 includes a sixth transistor T6; the compensation control circuit 31 includes a seventh transistor T7, the third reset circuit 32 includes an eighth transistor T8; the driving circuit 11 includes a driving transistor TO, the energy storage circuit 12 includes a storage capacitor C; the first initial voltage line and the second initial voltage line are the same initial voltage line I0; the light emitting element is an organic light emitting diode O1; the cathode of O1 is electrically connected to the low voltage line V01.

The gate electrode of the first transistor T1 is electrically connected to the light-emitting control line E1, the first electrode of the first transistor T1 is electrically connected to the second node N2, and the second electrode of the first transistor T1 is electrically connected to the first terminal of the driving circuit 11;

The gate electrode of the second transistor T2 is electrically connected to the first reset control line R1, the first electrode of the second transistor T2 is electrically connected to the reference voltage line V0, and the second electrode of the second transistor T2 is electrically connected to the second node N2;

The gate electrode of the third transistor T3 is electrically connected to the scan line M1, the first electrode of the third transistor T3 is electrically connected to the data line X1, and the second electrode of the third transistor T3 is electrically connected to the first terminal of the driving circuit 11;

The gate electrode of the fourth transistor T4 is electrically connected to the light-emitting control line 31, the first electrode of the fourth transistor T4 is electrically connected to the power supply voltage line VD, and the second electrode of the fourth transistor T4 is electrically connected to the first terminal of the driving circuit 11;

The gate electrode of the fifth transistor T5 is electrically connected to the light-emitting control line E1, the first electrode of the fifth transistor T5 is electrically connected to the second terminal of the driving circuit 11, and the second electrode of the fifth transistor T5 is electrically connected to the anode of O1;

The gate electrode of the sixth transistor T6 is electrically connected to the first reset control line R1, the first electrode of the sixth transistor T6 is electrically connected to the initial voltage line I0, and the second electrode of the sixth transistor T6 is electrically connected to the anode of O1;

The gate electrode of the seventh transistor T7 is electrically connected to the scan line M1, the first electrode of the seventh transistor T7 is electrically connected to the first node N1, and the second electrode of the seventh transistor T7 is electrically connected to the second terminal of the driving circuit 11;

The gate electrode of the eighth transistor T8 is electrically connected to the second reset control line R2, the first electrode of the eighth transistor T8 is electrically connected to the initial voltage line I0, and the second electrode of the eighth transistor T8 is electrically connected to the first node N1;

The gate electrode of the driving transistor T0 is electrically connected to the control terminal of the driving circuit 11, the first electrode of the driving transistor T0 is electrically connected to the first terminal of the driving circuit 11, and the second electrode of the driving transistor T0 is electrically connected to the second terminal of the driving circuit 11;

The first electrode plate of the storage capacitor C is electrically connected to the first node N1, and the second electrode plate of the storage capacitor C is electrically connected to the second node N2.

In at least one embodiment of the pixel circuit shown in FIG. 4, all transistors are p-type thin film transistors, but not limited thereto.

Figure 5:
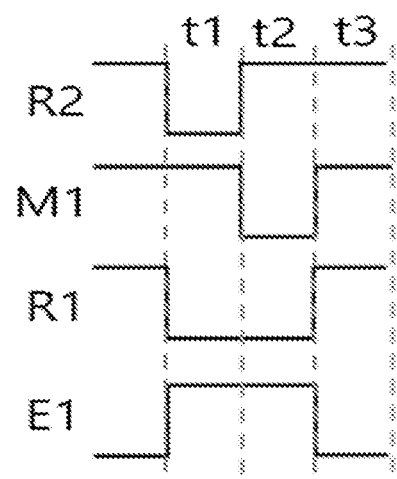
FIG. 5 is an timing diagram of the pixel circuit shown in FIG. 4 according to at least one embodiment of the present disclosure.
Figure 6:
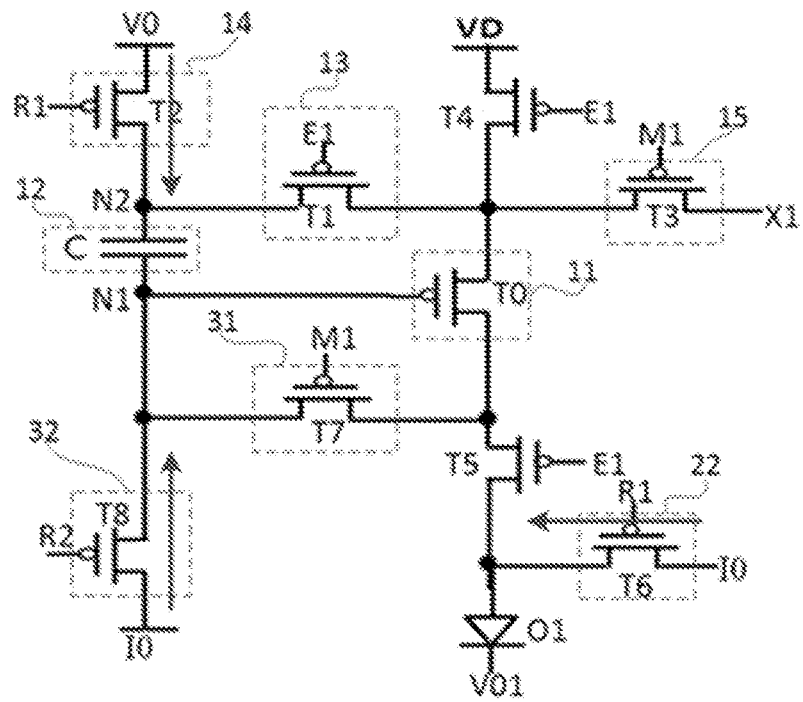
FIG. 6 is a schematic diagram of a working state of the pixel circuit shown in FIG. 4 in a reset phase according to at least one embodiment of the present disclosure.
Figure 7:
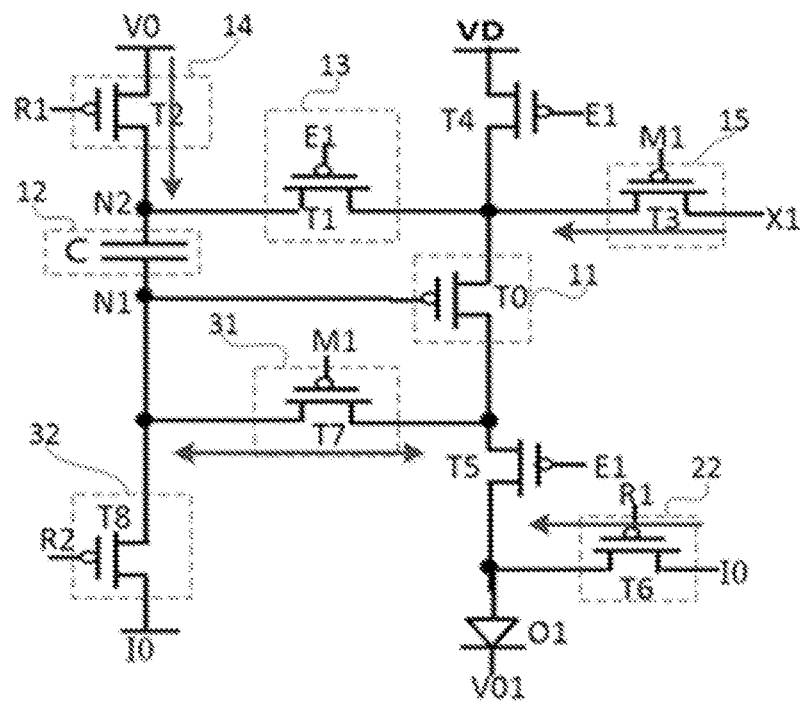
FIG. 7 is a schematic diagram of a working state of the pixel circuit shown in FIG. 4 in a data writing-in phase according to at least one embodiment of the present disclosure.
Figure 8:
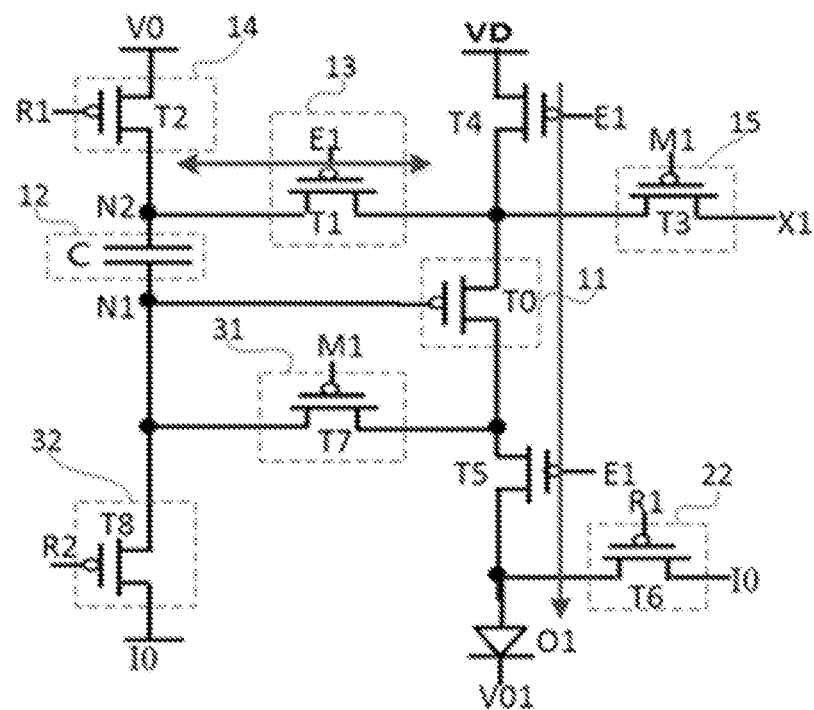
FIG. 8 is a schematic diagram of a working state of the pixel circuit shown in FIG. 4 in the light-emitting phase according to of at least one embodiment of the present disclosure.

As shown in FIG. 5, when the pixel circuit shown in FIG. 4 is in operation, the display period may include a reset phase t1, a data writing-in phase t2 and a light-emitting phase t3 that are set successively;

In the reset phase t1, R1 provides a low voltage signal, M1 provides a high voltage signal, R2 provides a low voltage signal, E1 provides a high voltage signal, as shown in FIG. 6, T2 is turned on, T8 is turned on, T6 is turned on, and the reference voltage Vref is written into N2, the initial voltage Vi provided by I0 is written into N1, so that when the data writing-in phase t2 starts, T0 can be turned on; Vi is written into the anode of O1, so that O1 does not emit light;

In the data writing-in phase t2, R1 provides a low voltage signal, M1 provides a low voltage signal, R2 provides a high voltage signal, and E1 provides a high voltage signal, as shown in FIG. 7, T2 is turned on, and the potential of N2 is Vref; T3 is turned on, T7 is turned on, the data voltage Vdata on the data line is written into the first electrode of T0; T6 is turned on to write Vi into the anode of O1, so that O1 does not emit light;

At the beginning of the data writing-in phase t2, T0 is turned on, and Vdata charges C through T3, T0 and T7 to increase the potential of N1 until T0 is turned off, at this time, the potential of N1 is Vdata+Vth;

In the light-emitting phase t3, R1 provides a high voltage signal, M1 provides a high voltage signal, R2 provides a high voltage signal, and E1 provides a low voltage signal, as shown in FIG. 8, T1 is turned on, T4 is turned on, T5 is turned on, and the potential of N2 becomes VDD_t3. At this time, the potential of N1 becomes Vdata+Vth+VDD_t3-Vref, at this time, the gate-source voltage of T0 is Vdata+Vth+VDD_t3-Vref-VDD_t3, and the current value of the driving current that T0 drives O1 to emit light is K (Vdata-Vref) 2; the current value of the driving current is irrelevant to the power supply voltage; wherein, VDD_t3 is the voltage value of the power supply voltage provided by VD in the light-emitting phase t3.

Figure 9:
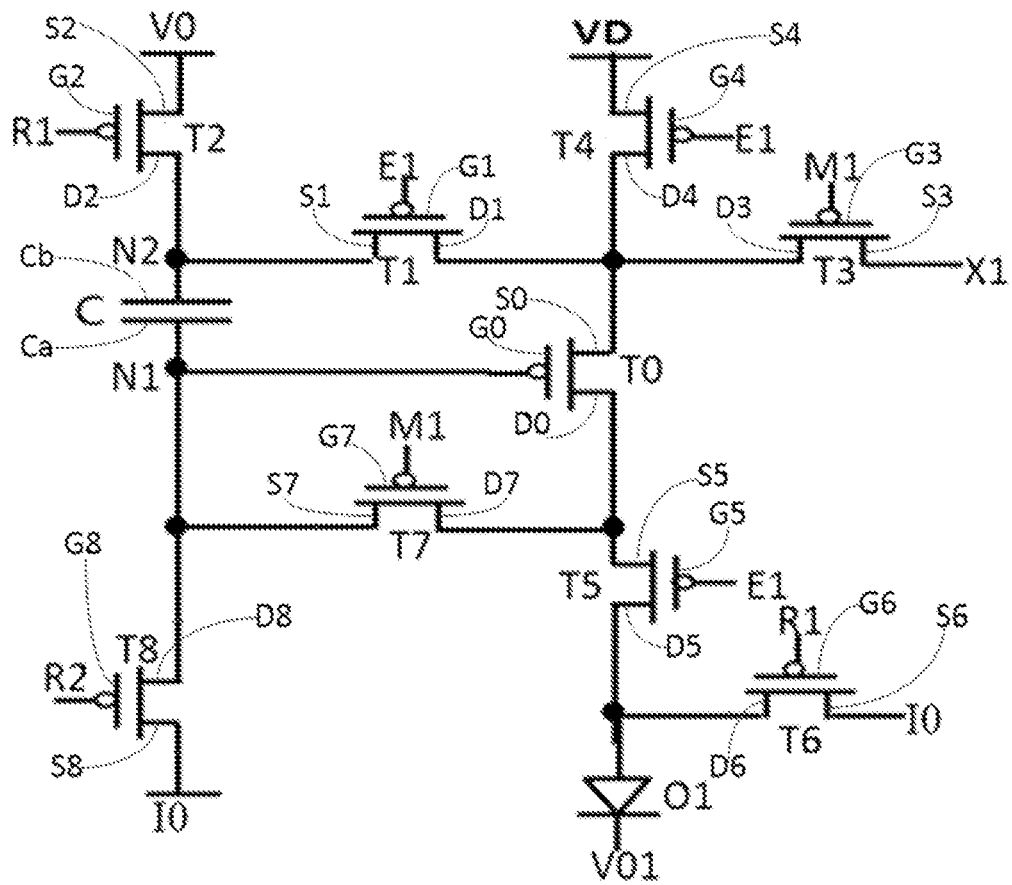
FIG. 9 is the schematic diagram showing the electrode of each transistor and the electrode plate of the storage capacitor on the basis of FIG. 4.

FIG. 9 is a simulation timing diagram of the pixel circuit shown in FIG. 4.

Figure 10:
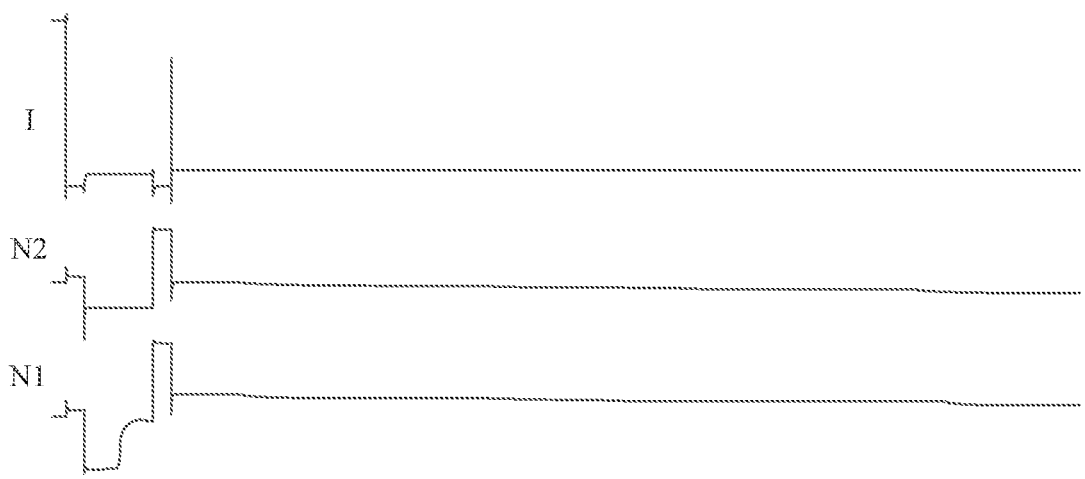
FIG. 10 is a simulation timing diagram of the pixel circuit shown in FIG. 4 according to at least one embodiment of the present disclosure.

FIG. 10 is a schematic diagram showing electrodes of each transistor and electrode plates of the storage capacitor based on FIG. 4. In FIG. 10, the reference number I is the current value of the driving current.

As shown in FIG. 10, the gate electrode G1 of the first transistor T1 is electrically connected to the light-emitting control line E1, the first electrode S1 of the first transistor T1 is electrically connected to the second node N2, and the second electrode D1 of the first transistor T1 is electrically connected to the first terminal of the driving circuit 11;

The gate electrode G2 of the second transistor T2 is electrically connected to the first reset control line R1, the first electrode S2 of the second transistor T2 is electrically connected to the reference voltage line V0, and the second electrode D2 of the second transistor T2 is electrically connected to the second node N2;

The gate electrode G3 of the third transistor T3 is electrically connected to the scan line M1, the first electrode S3 of the third transistor T3 is electrically connected to the data line X1, and the second electrode of the third transistor T3 D3 is electrically connected to the first terminal of the driving circuit 11;

The gate electrode G4 of the fourth transistor T4 is electrically connected to the light-emitting control line E1, the first electrode S4 of the fourth transistor T4 is electrically connected to the power supply voltage line VD, and the second electrode of the fourth transistor T4 is electrically connected to the first terminal of the driving circuit 11;

The gate electrode G5 of the fifth transistor T5 is electrically connected to the light-emitting control line E1, the first electrode S5 of the fifth transistor T5 is electrically connected to the second terminal of the driving circuit 11, and the second electrode D5 of the fifth transistor T5 is electrically connected to the anode of O1;

The gate electrode G6 of the sixth transistor T6 is electrically connected to the first reset control line R1, the first electrode S6 of the sixth transistor T6 is electrically connected to the initial voltage line I0, and the second electrode D6 of the sixth transistor T6 is electrically connected to the anode of O1;

The gate electrode G7 of the seventh transistor T7 is electrically connected to the scan line M1, the first electrode S7 of the seventh transistor T7 is electrically connected to the first node N1, and the second electrode of the seventh transistor T7 D7 is electrically connected to the second terminal of the driving circuit 11;

The gate electrode G8 of the eighth transistor T8 is electrically connected to the second reset control line R2, the first electrode S8 of the eighth transistor T8 is electrically connected to the initial voltage line I0, and the second electrode D8 of the eighth transistor T8 is electrically connected to the first node N1;

The gate electrode G0 of the driving transistor T0 is electrically connected to the control terminal of the driving circuit 11, the first electrode S0 of the driving transistor T0 is electrically connected to the first terminal of the driving circuit 11, and the second electrode D0 of the driving transistor T0 is electrically connected to the second terminal of the driving circuit 11;

The first electrode plate Ca of the storage capacitor C is electrically connected to the first node N1, and the second electrode plate Cb of the storage capacitor C is electrically connected to the second node N2.

The driving method described in the embodiment of the present disclosure is applied to the above-mentioned pixel circuit, and the display period includes a reset phase, a data writing-in phase, and a light-emitting phase that are set successively; the driving method includes:

In the reset phase, writing, by the first reset circuit, the reference voltage into the second node under the control of the first reset control signal;

In the data writing-in phase, writing, by the first reset circuit, the reference voltage into the second node under the control of the first reset control signal, and writing, by the data writing-in circuit, the data voltage into the first terminal of the driving circuit under the control of the scan signal;

In the light-emitting phase, controlling, by the first control circuit, to connect the second node and the first terminal of the driving circuit under the control of the light-emitting control signal.

In the driving method described in the embodiment of the present disclosure, the first control circuit is added to the pixel circuit, a state of mutual compensation of the power supply voltage between the data writing-in phase and the light-emitting phase is changed to another state of voltage self-compensation in the light-emitting phase, so that the influence of the IR voltage drop on the power supply voltage line on the light-emitting current of the light-emitting element is eliminated, the display uniformity of the display product is improved, and the flicker is reduced.

In at least one embodiment of the present disclosure, the pixel circuit further includes a light-emitting element, a light-emitting control circuit and a second reset circuit; the driving method further includes:

In the reset phase and the data writing-in phase, writing, by the second reset circuit, a first initial voltage into the first electrode of the light-emitting element under the control of a first reset control signal, so as to control the light-emitting element not to emit light;

In the light-emitting phase, under the control of the light-emitting control signal, controlling, by the light-emitting control circuit, to connect the power supply voltage line and the first terminal of the driving circuit, and connect the second terminal of the driving circuit and the first electrode of the light-emitting element.

In a specific implementation, the pixel circuit may further include a light-emitting control circuit and a second reset circuit. In the reset phase and the data writing-in phase, the second reset circuit resets the potential of the first electrode of the light-emitting element, so that the light-emitting element does not emit light; in the light-emitting phase, the light-emitting control circuit controls to connect the first terminal of the driving circuit and the power supply voltage line, and controls to connect the second terminal of the driving circuit and the second electrode of the light-emitting element.

In at least one embodiment of the present disclosure, the pixel circuit further includes a compensation control circuit and a third reset circuit; the driving method further includes:

In the reset phase, writing, by the third reset circuit, the second initial voltage into the first node under the control of the second reset control signal;

In the data writing-in phase, controlling, by the compensation control circuit, to connect the first node and the second terminal of the driving circuit under the control of the scan signal. In a specific implementation, the pixel circuit may further include a compensation control circuit and a third reset circuit, the third reset circuit resets the potential of the first node in the reset phase, and the compensation control circuit controls to connect the first node and the second terminal of the driving circuit in the data writing-in phase, so as to perform threshold voltage compensation.

The display substrate according to the embodiment of the present disclosure includes a base substrate, and a plurality of sub-pixels arranged on the base substrate, the sub-pixels including the above-mentioned pixel circuit.

Figure 11:
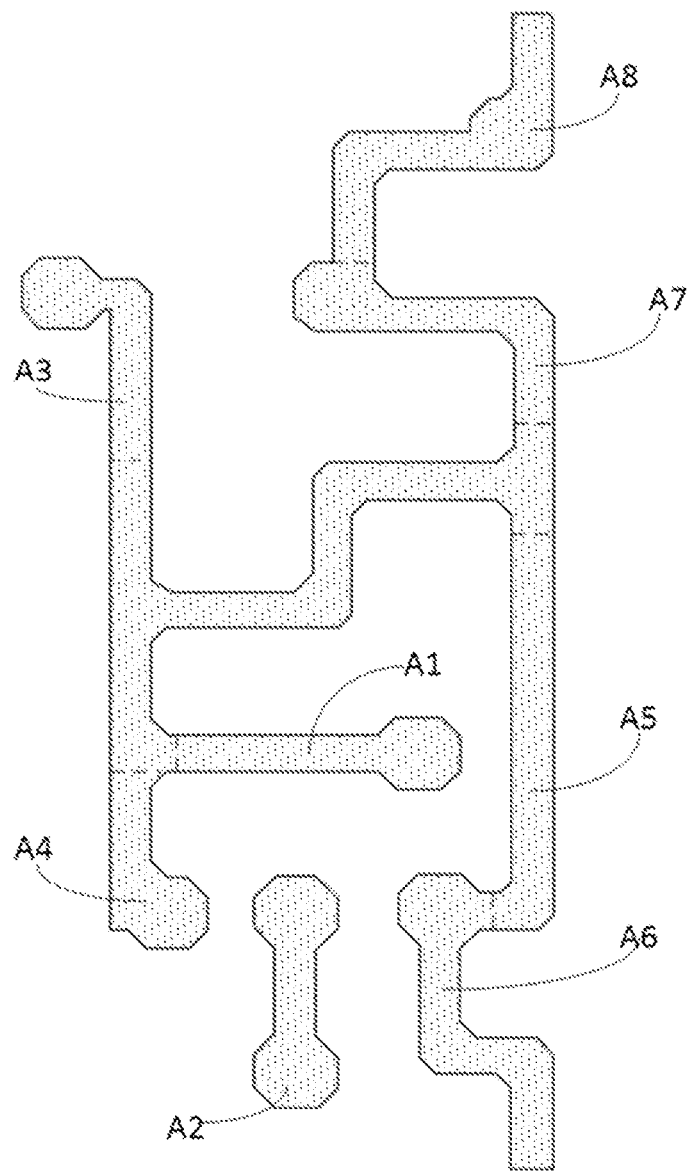
FIGS. 11 and 12 are layout diagrams of the active layer in FIG. 17.
Figure 13:
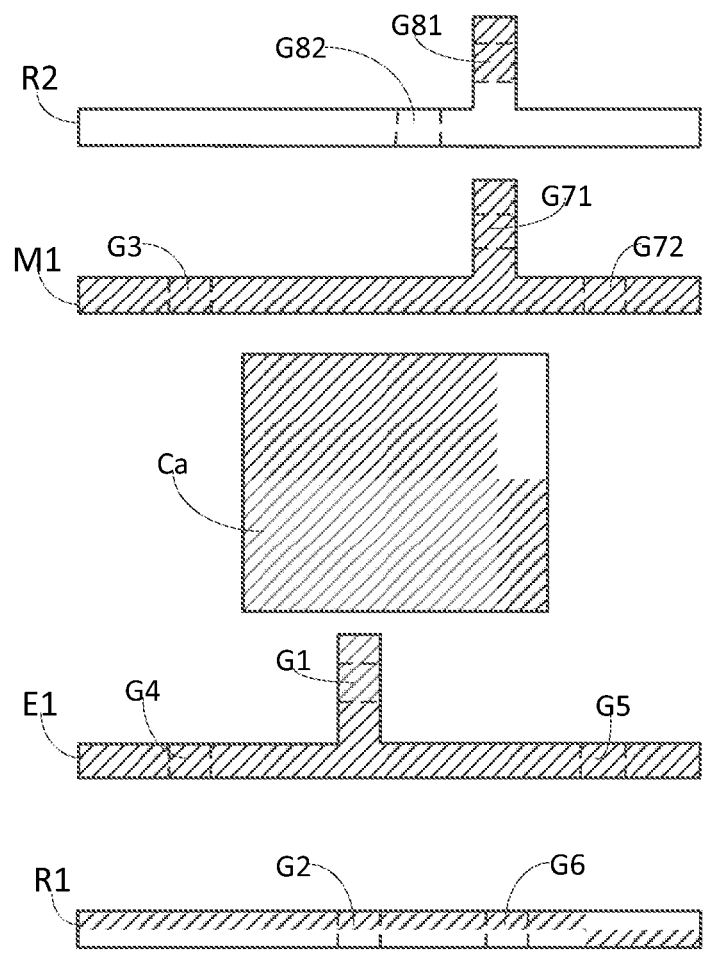
FIG. 13 is a layout diagram of the first gate metal layer in FIG. 17.

Optionally, as shown in FIG. 13, the sub-pixel includes a light-emitting control line E1, the pixel circuit includes a first control circuit and a driving circuit, the first control circuit includes a first transistor; the driving circuit includes a driving transistor; as shown in FIG. 11, the first transistor includes a first active pattern A1; at least part of the first active pattern A1 extends along a first direction;

As shown in FIG. 11 and FIG. 13, an orthographic projection of at least part of the first active pattern A1 on the base substrate is located between an orthographic projection of the gate electrode G0 of the driving transistor on the base substrate and the orthographic projection of the light emitting control line E1 on the substrate.

In the layout embodiments shown in FIGS. 11-17, the first direction may be a horizontal direction, but is not limited thereto.

In a specific implementation, the orthographic projection of at least part of the first active pattern A1 included in the first transistor on the base substrate is located between the orthographic projection of G0 on the base substrate and the orthographic projection of E1 on the base substrate. At least a part of A1 extends along the horizontal direction, so as to shorten the length of the pixel circuit in the longitudinal direction.

Optionally, the pixel circuit includes a light-emitting control circuit, and the light-emitting control circuit includes a fourth transistor and a fifth transistor;

As shown in FIG. 13, the gate electrode G1 of the first transistor includes a portion extending along a second direction;

The gate electrode G1 of the first transistor, the gate electrode G4 of the fourth transistor, the gate electrode G5 of the fifth transistor and the light emitting control line E1 form an integrated structure.

In the layout embodiments shown in FIGS. 11-17, the second direction may be a vertical direction, but is not limited thereto.

As shown in FIGS. 13, G4 and G5 are arranged in the horizontal direction, and the integrated structure formed by E1 and G1 is in an inverted T shape.

In at least one embodiment of the present disclosure, the first direction intersects the second direction.

Figure 14:
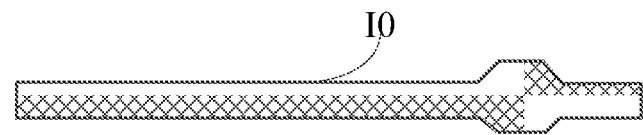
FIG. 14 is a layout diagram of the second gate metal layer in FIG. 17.
Figure 14:
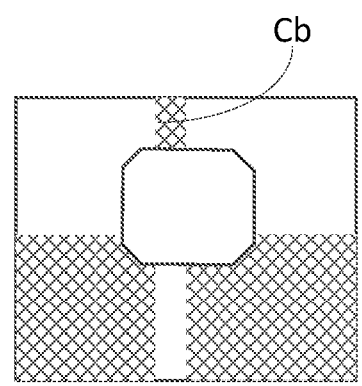
Figure 14:
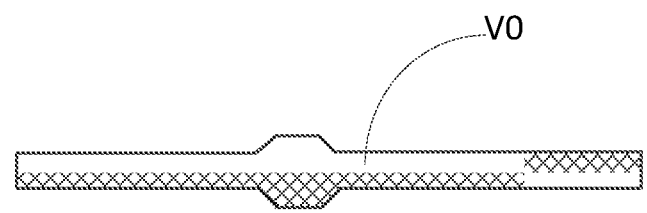

In at least one embodiment of the present disclosure, as shown in FIG. 13 and FIG. 14, the sub-pixel further includes a first reset control line R1 and a reference voltage line V0, and the pixel circuit further includes a first reset circuit and a second reset circuit, the first reset circuit includes a second transistor, and the second reset circuit includes a sixth transistor; as shown in FIG. 11, the second transistor includes a second active pattern A2, and the sixth transistor includes a sixth active pattern A6;

As shown in FIGS. 11-17, at least a portion of the second active pattern A2 extends along a second direction (the second direction may be a vertical direction), and at least a portion of the sixth active pattern A6 extends along a second direction. An orthographic projection of at least part of the second active pattern A2 on the base substrate is set between the orthographic projection of the light-emitting control line E1 on the base substrate and the orthographic projection of the reference voltage line V0 on the base substrate. An orthographic projection of at least part of the sixth active pattern A6 on the base substrate is located between the orthographic projection of the light-emitting control line E1 on the base substrate and the orthographic projection of the reference voltage line V0 on the base substrate.

During specific implementation, at least part of the second active pattern A2 included in the second transistor and at least part of the sixth active pattern A6 included in the sixth transistor may be arranged between V0 and E1.

Figure 12:
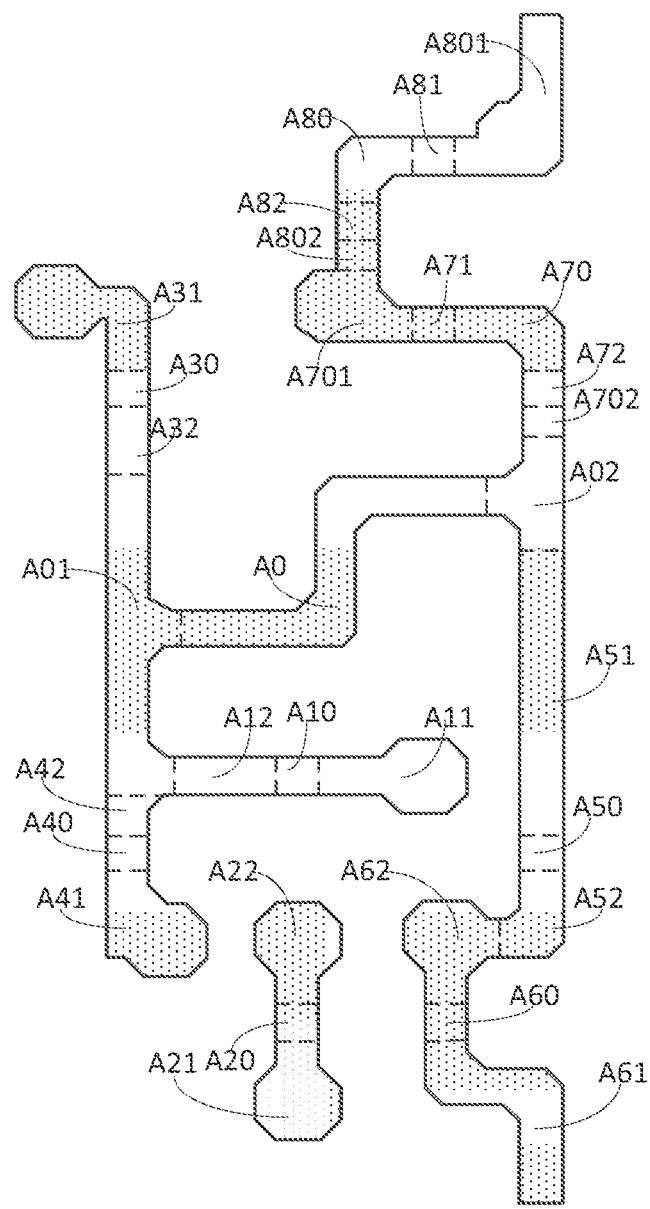

Optionally, as shown in FIG. 12, the second active pattern includes a second channel portion A20, and the sixth active pattern A6 includes a sixth channel portion A60; the second channel portion A20 and the sixth channel portions A60 are arranged along the first direction.

In at least one embodiment of the present disclosure, as shown in FIGS. 11-17, the orthographic projection of the first reset control line R1 on the base substrate is located between the orthographic projection of the light-emitting control line E1 on the base substrate and the orthographic projection of the reference voltage line V0 on the base substrate, at least part of the first reset control line R1, at least part of the light emitting control line E1 and at least part of the reference voltage line V0 are all extending along the first direction;

The gate electrode G2 of the second transistor, the gate electrode G6 of the sixth transistor and the first reset control line R1 form an integrated structure.

In a specific implementation, R1 is arranged between E1 and V0, and G2, G6 and R1 form an integrated structure.

Optionally, the sub-pixel further includes a second reset control line, an initial voltage line and a scan line; the third reset circuit includes an eighth transistor; the eighth transistor includes an eighth active pattern;

The eighth active pattern includes two semiconductor portions and one conductor portion; orthographic projections of the two semiconductor portions on the base substrate overlap the orthographic projection of the gate electrode of the eighth transistor on the base substrate respectively; an orthographic projection of the conductor portion on the base substrate does not overlap the orthographic projection of the gate electrode of the eighth transistor on the base substrate;

the conductor portion is coupled to the two semiconductor portions;

an orthographic projection of at least part of the eighth active pattern on the base substrate is located between an orthographic projection of the initial voltage line on the base substrate and an orthographic projection of the scan line on the base substrate;

The gate electrode of the eighth transistor and the second reset control line form an integrated structure, and the orthographic projection of the second reset control line on the base substrate is located between the orthographic projection of the initial voltage line on the base substrate and the orthographic projection of the scan line on the base substrate.

In a specific implementation, the eighth transistor may be a double-gate transistor, and at least part of the eighth active pattern included in the eighth transistor is arranged between the scan line and the initial voltage line.

Figure 15:
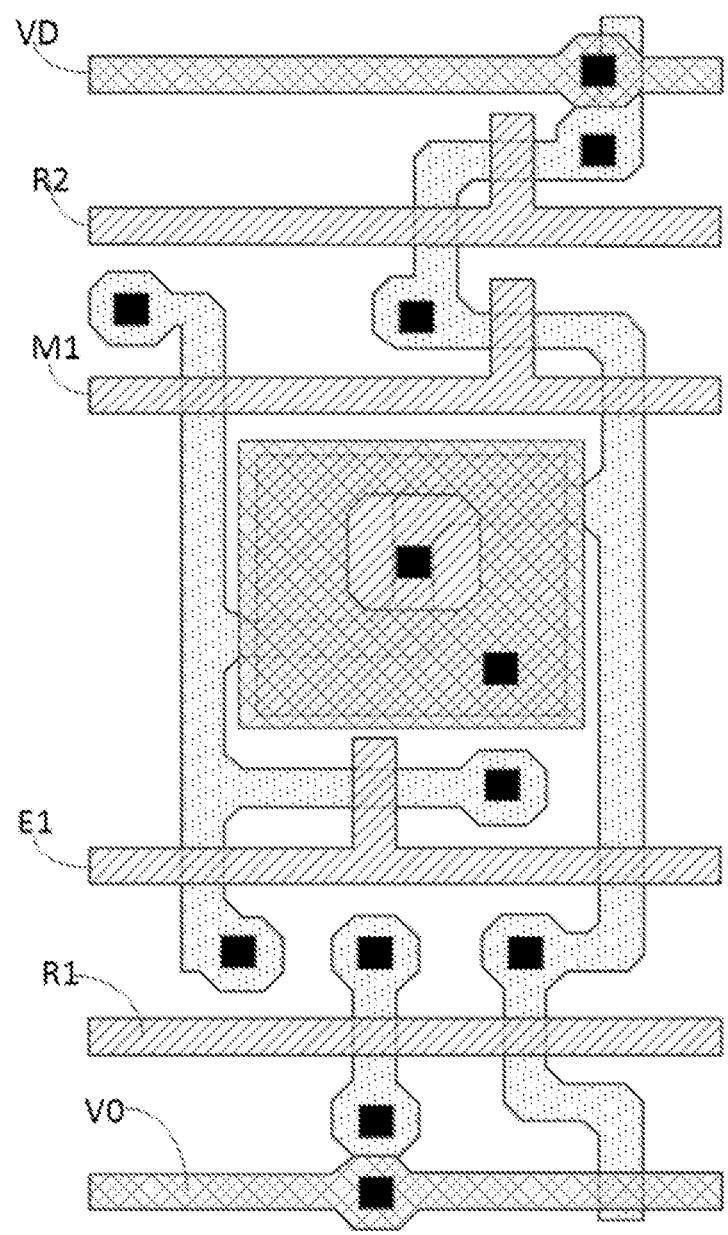
FIG. 15 is a schematic diagram of a via hole formed on a display substrate on which an active layer, a first gate metal layer and a second gate metal layer are formed.
Figure 16:
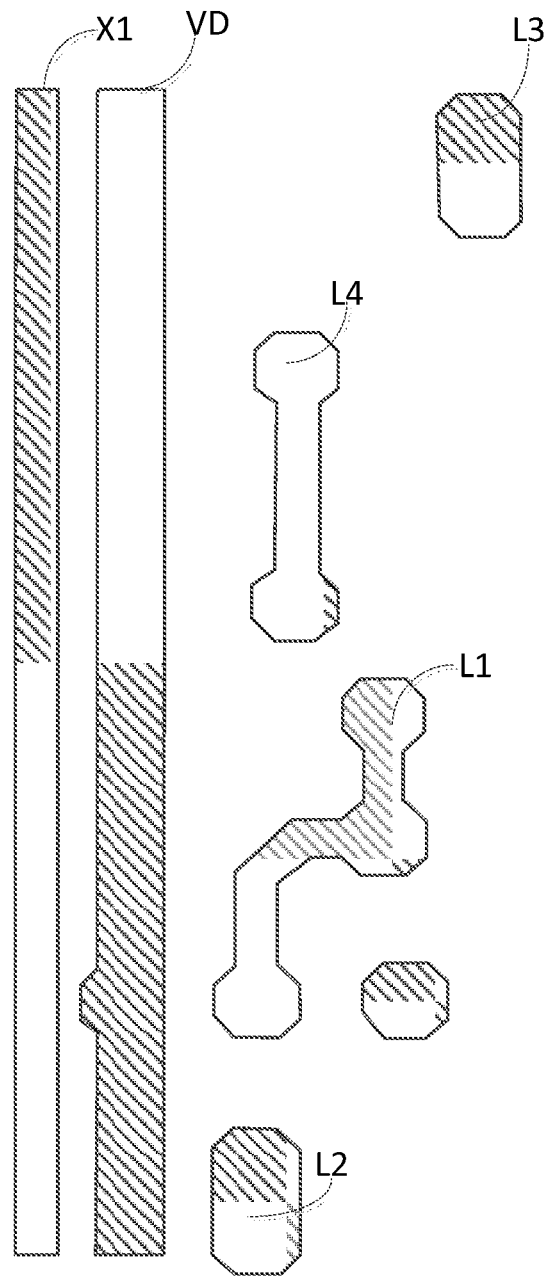
FIG. 16 is a layout diagram of the source-drain metal layer in FIG. 17.
Figure 17:
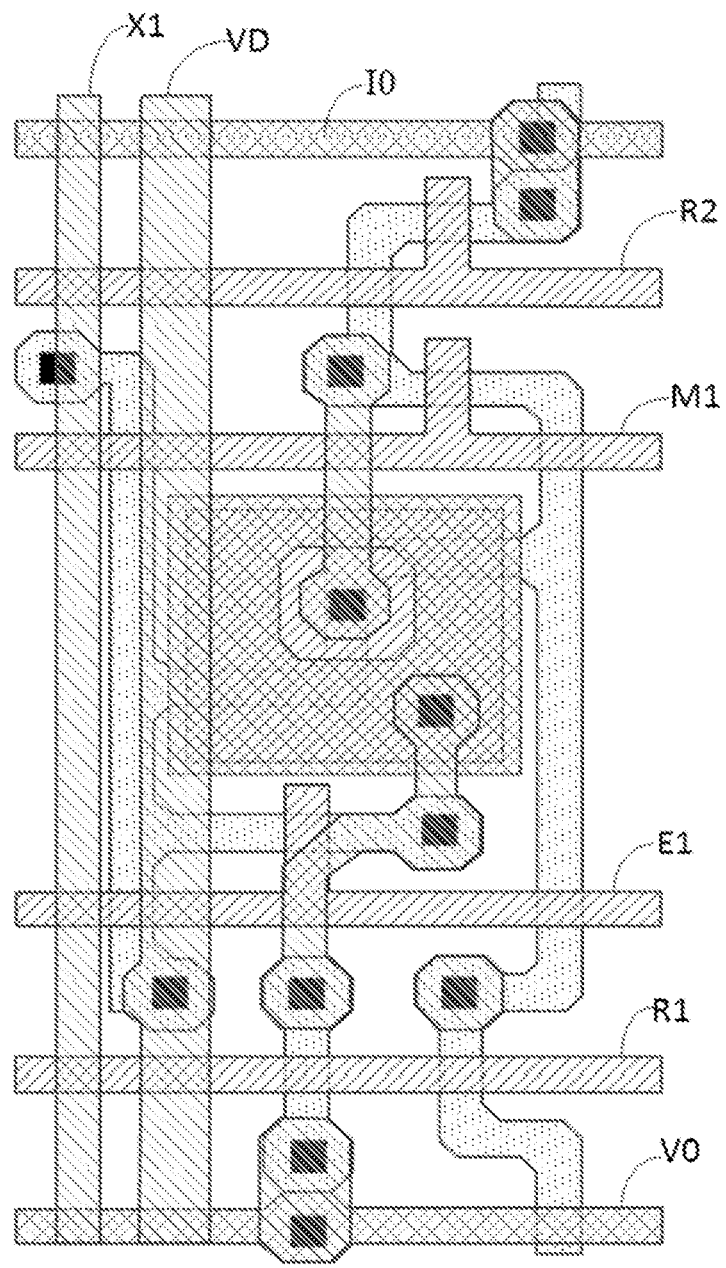
FIG. 17 is a layout diagram of the pixel circuit shown in FIG. 10 according to at least one embodiment of the present disclosure.

FIGS. 11 and 12 are layout diagrams of the active layer in FIG. 17, FIG. 13 is a layout diagram of the first gate metal layer in FIG. 17, and FIG. 14 is a layout diagram of the second gate metal layer in FIG. 17. FIG. 16 is a layout diagram of the source-drain metal layer in FIG. 17, FIG. 17 is a layout diagram of the pixel circuit shown in FIG. 10, and FIG. 15 is a schematic diagram of via holes formed on the display substrate on which the first gate metal layer and the second gate metal layer are formed.

As shown in FIGS. 11-17, the sub-pixel further includes a second reset control line R2, an initial voltage line I0 and a scan line M1; the third reset circuit includes an eighth transistor; the eighth transistor includes an eighth active pattern A8;

As shown in FIG. 12, the eighth active pattern includes a first eighth semiconductor portion A81, a second eighth semiconductor portion A82, a first connection conductor portion A80, a first eighth conductive portion A801, and a second eighth conductive portion A802; A80 is coupled to A81 and A82 respectively; A801 is coupled to A81, and A802 is coupled to A82;

As shown in FIG. 13, the eighth transistor includes two gate electrodes, the first gate electrode of the eighth transistor is marked as G81, and the second gate electrode of the eighth transistor is marked as G82;

As shown in FIGS. 11-17, the orthographic projection of G81 on the base substrate overlaps the orthographic projection of A81 on the base substrate, and the orthographic projection of G82 on the base substrate overlaps the orthographic projection of A82 on the base substrate.

In FIG. 13, the gate electrode of the first transistor T1 is labeled G1, the gate electrode of the second transistor T2 is labeled G2, the gate electrode of the third transistor T3 is labeled G3, and the gate electrode of the four transistors T4 is labeled G4, the gate electrode of the fifth transistor T5 is labeled G5, the gate electrode of the sixth transistor T6 is labeled G6, the first gate electrode of the seventh transistor T7 is labeled g71, the second gate electrode of T7 is labeled G72s, the first electrode plate of the storage capacitor C is labeled Ca is, and Ca is multiplexed as the gate electrode of the driving transistor.

In FIG. 11, the seventh active pattern is labeled A7, T7 includes the seventh active pattern A7, as shown in FIG. 12, the seventh active pattern includes the first seventh semiconductor portion A71, the second seventh semiconductor portion A72, the second connection conductor portion A70, the first seventh conductive portion A701 and the second seventh conductive portion A702; A701 is used as the first electrode of T7, and A702 is used as the second electrode of T7; as shown in FIGS. 11-17, the orthographic projection of A71 on the base substrate overlaps the orthographic projection of G71 on the base substrate, and the orthographic projection of A72 on the base substrate overlaps the orthographic projection of G72 on the base substrate; A70 is coupled to A71 and A72 respectively; A71 is coupled to A701, and A72 is coupled to A702.

In FIG. 12, the driving channel portion in the active pattern included in the driving transistor is labeled A0;

As shown in FIG. 12, A02 is the second driving conductive portion in the active pattern included in the driving transistor; A02 is coupled to A702; A02 is used as the second electrode of the driving transistor;

A01 is the first driving conductive portion in the active pattern included in the driving transistor, and A01 is used as the first electrode of the driving transistor.

As shown in FIG. 11, the fifth active pattern is labeled A5, and T5 includes the fifth active pattern A5; as shown in FIG. 12, the fifth active pattern includes the first fifth conductive portion A51, the fifth channel portion A50 and the second fifth conductive portion A52 that are arranged along the vertical direction from top to bottom; A51 is coupled to A02;

A51 is used as the first electrode of T5, and A52 is used as the second electrode of T5;

As shown in FIG. 12, the sixth active pattern A6 included in the sixth transistor includes a first sixth conductive portion A61, a sixth channel portion A60, and a second sixth conductive portion A62 that are arranged from bottom to up along the vertical direction; A62 is coupled to A52;

A61 is used as the first electrode of T6, and A62 is used as the second electrode of T6;

As shown in FIG. 11, the third transistor includes a third active pattern A3; as shown in FIG. 12, the third active pattern A3 includes a first third conductive portion A31, a third channel portion A30, and the second third conductive portion A32 that are arranged from bottom to up along the vertical direction; A32 is coupled to A01;

A31 is used as the first electrode of T3, and A32 is used as the second electrode of T3.

As shown in FIG. 11 to FIG. 17, A31 is electrically connected to the data line X1 through a via hole.

In FIG. 16, the line labeled X1 is the data line, and the line labeled VD is the power supply voltage line.

As shown in FIG. 11, the fourth transistor includes a fourth active pattern A4; as shown in FIG. 12, the fourth active pattern A4 includes a first fourth conductive portion A41, a fourth channel portion A40, and a second fourth conductive portion A42 that are arranged from bottom to up along the vertical direction; A42 is coupled to A01;

A41 is used as the first electrode of T4, and A42 is used as the second electrode of T4.

As shown in FIGS. 11-17, A41 is electrically connected to VD through a via hole.

As shown in FIG. 11, the first transistor includes a first active pattern A1; as shown in FIG. 12, the first active pattern A1 includes a first first conductive portion A11, a first channel portion A10, and a second first conductive portion A12 that arranged from right to left along the horizontal direction; A12 is coupled to A42;

A11 is used as the first electrode of T1, and A12 is used as the second electrode of T2.

As shown in FIGS. 11-17, A11 is electrically connected to the first conductive connection part L1 through the via hole, and the first conductive connection portion L1 is electrically connected to the second electrode plate Cb of the storage capacitor C through the via hole, so that the A11 is electrically connected to Cb.

As shown in FIG. 11, the second transistor T2 includes a second active pattern A2; as shown in FIG. 12, the second active pattern A2 includes a first second conductive portion A21, a second channel portion A20, and a second second conductive portion A22 that are arranged in sequence from bottom to up along the vertical direction;

As shown in FIG. 11-FIG. 17, A21 is electrically connected to the second conductive connection portion L2 through a via hole, and L2 is electrically connected to V0 through a via hole, so that A21 is electrically connected to V0;

A21 is used as the first electrode of T2, and A22 is used as the second electrode of T2.

As shown in FIG. 11 to FIG. 17, the first eighth conductive portion A801 is electrically connected to the third conductive connection portion L3 through the via hole, and the L3 is electrically connected to the initial voltage line I0 through the via hole, so that the first eighth conductive portion A801 is electrically connected to I0;

The first seventh conductive portion A701 is electrically connected to the fourth conductive connection portion L4 through a via hole, and the L4 is electrically connected to the first electrode plate Ca of the storage capacitor through a via hole, so that A701 is electrically connected to Ca.

In FIG. 13, the line labeled R2 is the second reset control line, the line labeled M1 is the scan line, the line labeled E1 is the light-emitting control line, and the line labeled R1 is the first reset control line.

In FIG. 14, the line labeled I0 is the initial control line, and the line labeled V0 is the reference voltage line.

In FIG. 16, the line labeled X1 is the data line, and the line labeled VD is the power supply voltage line.

When manufacturing the display substrate described in at least one embodiment of the present disclosure, firstly, a semiconductor material layer is arranged on the base substrate, and a patterning process is performed on the semiconductor material layer to form the active layer of each transistor;

a first gate insulating layer is formed on a side of the active layer away from the base substrate;

a first gate metal layer is formed on a side of the first gate insulating layer away from the active layer, and a patterning process is performed on the first gate metal layer to form the gate electrode of each transistor, the first reset control line R1, the second reset control line R2, the scan line M1 and light-emitting control line E1;

Using the gate electrode of each transistor as a mask, doping a part of the active layer not covered by the gate electrode, so that the part of the active layer not covered by the gate electrode is formed as a conductive portion, a part of the active layer covered by the gate electrode is formed as a channel portion; the conductive portion serves as a first electrode or a second electrode; or the conductive portion is coupled to the first electrode or the second electrode;

A second gate metal layer is formed on the side of the second gate insulating layer away from the first gate metal layer, and a patterning process is performed on the second gate metal layer to form an initial voltage line I0, a reference voltage line V0 and the second electrode plate Cb of the storage capacitor C;

an insulating layer is formed on a side of the second gate metal layer away from the second gate insulating layer;

a plurality of via holes are formed on the substrate provided with the active layer, the first gate insulating layer, the first gate metal layer, the second gate insulating layer, the second gate metal layer and the insulating layer;

A source-drain metal layer is formed on a side of the insulating layer away from the second gate metal layer, and a patterning process is performed on the source-drain metal layer to form a power supply voltage line VD, a data line X1 and each conductive connection portion.

In at least one embodiment of the present disclosure, the light-emitting control lines included in the sub-pixels in the same row are electrically connected to each other and form an integrated structure;

The first reset control lines included in the sub-pixels in the same row are electrically connected to each other and form an integrated structure;

The second reset control lines included in the sub-pixels in the same row are electrically connected to each other and form an integrated structure;

The scan lines included in the sub-pixels located in the same row are electrically connected to each other and form an integrated structure;

The initial voltage lines included in the sub-pixels located in the same row are electrically connected to each other and form an integrated structure;

The reference voltage lines included in the sub-pixels in the same row are electrically connected to each other and form an integrated structure;

The power supply voltage lines included in the sub-pixels located in the same row are electrically connected to each other and form an integrated structure;

The data lines included in the sub-pixels located in the same column are electrically connected to each other and form an integrated structure;

The high-voltage lines included in the sub-pixels located in the same column are electrically connected to each other and form an integrated structure.

The display device according to the embodiment of the present disclosure includes the above-mentioned display substrate.

The display device provided by the embodiments of the present disclosure may be any product or component with display function, such as a mobile phone, a tablet computer, a television, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A pixel circuit, comprising a driving circuit, an energy storage circuit, a first control circuit, a first reset circuit and a data writing-in circuit; wherein
a first terminal of the energy storage circuit is electrically connected to a first node, a second terminal of the energy storage circuit is electrically connected to a second node, and the energy storage circuit is used for storing electrical energy;
a control terminal of the driving circuit is electrically connected to the first node;
the first control circuit is respectively electrically connected to a light-emitting control line, the second node and a first terminal of the driving circuit, and is configured to control to connect the second node and the first terminal of the driving circuit under the control of a light-emitting control signal provided by the light-emitting control line;
the first reset circuit is respectively electrically connected to a first reset control line, a reference voltage line and the second node, and is configured to write a reference voltage provided by the reference voltage line into the second node under the control of a first reset control signal provided by the first reset control line;
the data writing-in circuit is electrically connected to a scan line, a data line and the first terminal of the driving circuit respectively, and is configured to write a data voltage provided by the data line into the first terminal of the driving circuit under the control of a scan signal provided by the scan line;
the driving circuit is configured to control to connect the first terminal of the driving circuit and a second terminal of the driving circuit under the control of a control terminal of the driving circuit.

2. The pixel circuit according to claim 1, further comprising a light-emitting element and a light-emitting control circuit; wherein
the light-emitting control circuit is respectively electrically connected to the light-emitting control line, a power supply voltage line, the first terminal of the driving circuit, the second terminal of the driving circuit and a first electrode of the light-emitting element, and is configured to control to connect the power supply voltage line and the first terminal of the driving circuit and control to connect the second terminal of the driving circuit and the first electrode of the light-emitting element under the control of the light-emitting control signal; a second electrode of the light-emitting element is electrically connected to the first voltage line.

3. The pixel circuit according to claim 2, further comprising a second reset circuit; wherein
the second reset circuit is electrically connected to the first reset control line, a first initial voltage line, and the first electrode of the light-emitting element, respectively, and is configured to write the first initial voltage provided by the first initial voltage line into the first electrode of the light-emitting element under the control of the first reset control signal.

4. The pixel circuit according to claim 3, further comprising a compensation control circuit and a third reset circuit; wherein
the compensation control circuit is electrically connected to the scan line, the first node and the second terminal of the driving circuit respectively, and is configured to control to connect the first node and the second terminal of the driving circuit under the control of the scan signal provided by the scan line;
the third reset circuit is electrically connected to the second reset control line, a second initial voltage line and the first node, respectively, and is configured to write a second initial voltage provided by the second initial voltage line into the first node under the control of a second reset control signal provided by the second reset control line.

5. The pixel circuit according to claim 1, wherein the first control circuit comprises a first transistor;
a gate electrode of the first transistor is electrically connected to the light-emitting control line, a first electrode of the first transistor is electrically connected to the second node, and a second electrode of the first transistor is electrically connected to the first terminal of the driving circuit.

6. The pixel circuit according to claim 1, wherein the first reset circuit comprises a second transistor;
a gate electrode of the second transistor is electrically connected to the first reset control line, a first electrode of the second transistor is electrically connected to the reference voltage line, and a second electrode of the second transistor is electrically connected to the second node.

7. The pixel circuit according to claim 1, wherein the data writing-in circuit comprises a third transistor;
a gate electrode of the third transistor is electrically connected to the scan line, a first electrode of the third transistor is electrically connected to the data line, and a second electrode of the third transistor is electrically connected to the first terminal of the driving circuit.

8. The pixel circuit according to claim 3, wherein the light-emitting control circuit includes a fourth transistor and a fifth transistor, and the second reset circuit includes a sixth transistor;
a gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit;
a gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element;

a gate electrode of the sixth transistor is electrically connected to the first reset control line, a first electrode of the sixth transistor is electrically connected to the first initial voltage line, and a second electrode of the sixth transistor is electrically connected to the first electrode of the light-emitting element.

9. The pixel circuit according to claim 4, wherein the compensation control circuit comprises a seventh transistor, and the third reset circuit comprises an eighth transistor;

a gate electrode of the seventh transistor is electrically connected to the scan line, a first electrode of the seventh transistor is electrically connected to the first node, and a second electrode of the seventh transistor is electrically connected to the second terminal of the driving circuit;

a gate electrode of the eighth transistor is electrically connected to the second reset control line, a first electrode of the eighth transistor is electrically connected to the second initial voltage line, and a second electrode of the eighth transistor is electrically connected to the first node.

10. The pixel circuit according to claim 1, wherein the driving circuit includes a driving transistor, and the energy storage circuit includes a storage capacitor;

a gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit;

a first electrode plate of the storage capacitor is electrically connected to the first node, and a second electrode plate of the storage capacitor is electrically connected to the second node.

11. The pixel circuit according to claim 4, wherein the first control circuit includes a first transistor; the first reset circuit includes a second transistor; the data writing-in circuit includes a third transistor; the light-emitting control circuit includes a fourth transistor and a fifth transistor, the second reset circuit includes a sixth transistor; the compensation control circuit includes a seventh transistor, the third reset circuit includes an eighth transistor; the driving circuit includes a driving transistor, the energy storage circuit includes a storage capacitor; the first initial voltage line and the second initial voltage line are a same initial voltage line;

a gate electrode of the first transistor is electrically connected to the light-emitting control line, a first electrode of the first transistor is electrically connected to the second node, and a second electrode of the first transistor is electrically connected to the first terminal of the driving circuit;

a gate electrode of the second transistor is electrically connected to the first reset control line, a first electrode of the second transistor is electrically connected to the reference voltage line, and a second electrode of the second transistor is electrically connected to the second node;

a gate electrode of the third transistor is electrically connected to the scan line, a first electrode of the third transistor is electrically connected to the data line, and a second electrode of the third transistor is electrically connected to the first terminal of the driving circuit;

a gate electrode of the fourth transistor is electrically connected to the light-emitting control line, a first electrode of the fourth transistor is electrically connected to the power supply voltage line, and a second electrode of the fourth transistor is electrically connected to the first terminal of the driving circuit;

a gate electrode of the fifth transistor is electrically connected to the light-emitting control line, a first electrode of the fifth transistor is electrically connected to the second terminal of the driving circuit, and a second electrode of the fifth transistor is electrically connected to the first electrode of the light-emitting element;

a gate electrode of the sixth transistor is electrically connected to the first reset control line, a first electrode of the sixth transistor is electrically connected to the initial voltage line, and a second electrode of the sixth transistor is electrically connected to the first electrode of the light-emitting element;

a gate electrode of the seventh transistor is electrically connected to the scan line, a first electrode of the seventh transistor is electrically connected to the first node, and a second electrode of the seventh transistor is electrically connected to the second terminal of the driving circuit;

a gate electrode of the eighth transistor is electrically connected to the second reset control line, a first electrode of the eighth transistor is electrically connected to the initial voltage line, and a second electrode of the eighth transistor is electrically connected to the first node;

a gate electrode of the driving transistor is electrically connected to the control terminal of the driving circuit, a first electrode of the driving transistor is electrically connected to the first terminal of the driving circuit, and a second electrode of the driving transistor is electrically connected to the second terminal of the driving circuit;

a first electrode plate of the storage capacitor is electrically connected to the first node, and a second electrode plate of the storage capacitor is electrically connected to the second node.

12. A driving method, applied to the pixel circuit according to claim 1, wherein a display period comprises a reset phase, a data writing-in phase and a light-emitting phase that are set successively; the driving method comprises:

in the reset phase, writing, by the first reset circuit, the reference voltage into the second node under the control of the first reset control signal;

in the data writing-in phase, writing, by the first reset circuit, the reference voltage into the second node under the control of the first reset control signal, and writing, by the data writing-in circuit, the data voltage into the first terminal of the driving circuit under the control of the scan signal;

in the light-emitting phase, controlling, by the first control circuit, to connect the second node and the first terminal of the driving circuit under the control of the light-emitting control signal.

13. The driving method according to claim 12, wherein the pixel circuit further comprises a light-emitting element, a light-emitting control circuit and a second reset circuit; the driving method further comprises:

in the reset phase and the data writing-in phase, writing, by the second reset circuit, a first initial voltage into the first electrode of the light-emitting element under the control of a first reset control signal, so as to control the light-emitting element not to emit light;

in the light-emitting phase, under the control of the light-emitting control signal, controlling, by the light-emitting control circuit, to connect the power supply voltage line and the first terminal of the driving circuit, and connect the second terminal of the driving circuit and the first electrode of the light-emitting element.

14. The driving method according to claim 12, wherein the pixel circuit further comprises a compensation control circuit and a third reset circuit; the driving method further comprises:

in the reset phase, writing, by the third reset circuit, the second initial voltage into the first node under the control of the second reset control signal;

in the data writing-in phase, controlling, by the compensation control circuit, to connect the first node and the second terminal of the driving circuit under the control of the scan signal.

15. A display substrate comprising a base substrate, and a plurality of sub-pixels arranged on the base substrate, each of the plurality of sub-pixels comprising the pixel circuit according to claim 1.

16. The display substrate according to claim 15, wherein the sub-pixel includes a light-emitting control line, the pixel circuit includes a first control circuit and a driving circuit, the first control circuit includes a first transistor; the driving circuit includes a driving transistor, the first transistor includes a first active pattern; at least part of the first active pattern extends along a first direction;

an orthographic projection of at least part of the first active pattern on the base substrate is located between an orthographic projection of a gate electrode of the driving transistor on the base substrate and an orthographic projection of the light emitting control line on the base substrate.

17. The display substrate according to claim 15, wherein the pixel circuit includes a light-emitting control circuit, and the light-emitting control circuit includes a fourth transistor and a fifth transistor;

a gate electrode of the first transistor includes a portion extending along a second direction;

the gate electrode of the first transistor, a gate electrode of the fourth transistor, a gate electrode of the fifth transistor and the light emitting control line form an integrated structure.

18. The display substrate according to claim 15, wherein the sub-pixel further includes a first reset control line and a reference voltage line, and the pixel circuit further includes a first reset circuit and a second reset circuit, the first reset circuit includes a second transistor, and the second reset circuit includes a sixth transistor; the second transistor includes a second active pattern, and the sixth transistor includes a sixth active pattern;

at least a portion of the second active pattern extends along the second direction, and at least a portion of the sixth active pattern extends along the second direction, an orthographic projection of at least part of the second active pattern on the base substrate is located between the orthographic projection of the light-emitting control line on the base substrate and an orthographic projection of the reference voltage line on the base substrate, an orthographic projection of at least part of the sixth active pattern on the base substrate is located between the orthographic projection of the light-emitting control line on the base substrate and the orthographic projection of the reference voltage line on the base substrate.

19. The display substrate according to claim 18, wherein the second active pattern includes a second channel portion, and the sixth active pattern includes a sixth channel portion; the second channel portion and the sixth channel portion are arranged along the first direction;

or wherein an orthographic projection of the first reset control line on the base substrate is located between the orthographic projection of the light-emitting control line on the base substrate and the orthographic projection of the reference voltage line on the base substrate, at least part of the first reset control line, at least part of the light emitting control line and at least part of the reference voltage line all extend along the first direction;

a gate electrode of the second transistor, a gate electrode of the sixth transistor and the first reset control line form an integrated structure.

20. The display substrate according to claim 15, wherein the sub-pixel further includes a second reset control line, an initial voltage line and a scan line; the third reset circuit includes an eighth transistor; the eighth transistor includes an eighth active pattern;

the eighth active pattern includes two semiconductor portions and one conductor portion; orthographic projections of the two semiconductor portions on the base substrate overlap an orthographic projection of a gate electrode of the eighth transistor on the base substrate respectively; an orthographic projection of the conductor portion on the base substrate does not overlap the orthographic projection of the gate electrode of the eighth transistor on the base substrate;

the conductor portion is coupled to the two semiconductor portions;

an orthographic projection of at least part of the eighth active pattern on the base substrate is located between an orthographic projection of the initial voltage line on the base substrate and an orthographic projection of the scan line on the base substrate;

the gate electrode of the eighth transistor and the second reset control line form an integrated structure, and an orthographic projection of the second reset control line on the base substrate is located between the orthographic projection of the initial voltage line on the base substrate and the orthographic projection of the scan line on the base substrate.

* * * * *